United States Patent
Chen et al.

(10) Patent No.: US 10,573,520 B2
(45) Date of Patent: Feb. 25, 2020

(54) MULTIPLE PATTERNING SCHEME INTEGRATION WITH PLANARIZED CUT PATTERNING

(71) Applicant: INTERNATIONAL BUSINESS MACHINES CORPORATION, Armonk, NY (US)

(72) Inventors: Hsueh-Chung Chen, Cohoes, NY (US); Yongan Xu, Niskayuna, NY (US); Lawrence A. Clevenger, Saratoga Springs, NY (US); Yann Mignot, Slingerlands, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/006,270

(22) Filed: Jun. 12, 2018

(65) Prior Publication Data

US 2019/0378718 A1    Dec. 12, 2019

(51) Int. Cl.
*H01L 21/033* (2006.01)
*H01L 21/027* (2006.01)
(Continued)

(52) U.S. Cl.
CPC ........ *H01L 21/0338* (2013.01); *G03F 7/0035* (2013.01); *G03F 7/091* (2013.01);
(Continued)

(58) Field of Classification Search
CPC ........... H01L 21/0338; H01L 21/02115; H01L 21/02123; H01L 21/0217; H01L 21/02266; H01L 21/0276; H01L 21/0332; H01L 21/0337; H01L 21/31051; H01L 21/02126; G03F 7/0035; G03F 7/091; G03F 7/16;
(Continued)

(56) References Cited

U.S. PATENT DOCUMENTS

| 6,693,050 B1 * | 2/2004 | Cui ................... H01L 21/76229 |
|---|---|---|
| | | 257/E21.548 |
| 9,064,813 B2 | 6/2015 | Kanakasabapathy et al. |

(Continued)

OTHER PUBLICATIONS

Raley, "Self-aligned Blocking Demonstration for Critical Sub-40nm Pitch Mx Level Patterning", Proceedings of SPIE, Apr. 2018, pp. 1-12.

(Continued)

*Primary Examiner* — Shahed Ahmed
(74) *Attorney, Agent, or Firm* — Tutunjian & Bitetto, P.C.; Vazken Alexanian

(57) ABSTRACT

A method for fabricating a semiconductor device integrating a multiple patterning scheme includes forming a plurality of mandrels from a base structure, forming a plurality of non-mandrels including a hard mask material having an etch property substantially similar to that of the plurality of mandrels, forming photo-sensitive material or a memorization layer over the plurality of mandrels and the plurality of non-mandrels, and applying an exposure scheme to the photo-sensitive material or the memorization layer to create at least one mandrel cut pattern and at least one non-mandrel cut pattern.

20 Claims, 7 Drawing Sheets

(51) Int. Cl.
  *H01L 21/02* (2006.01)
  *H01L 21/3105* (2006.01)
  *G03F 7/00* (2006.01)
  *G03F 7/16* (2006.01)
  *G03F 7/20* (2006.01)
  *G03F 7/09* (2006.01)

(52) U.S. Cl.
  CPC .............. *G03F 7/16* (2013.01); *G03F 7/2004* (2013.01); *G03F 7/2022* (2013.01); *H01L 21/0217* (2013.01); *H01L 21/0276* (2013.01); *H01L 21/02115* (2013.01); *H01L 21/02123* (2013.01); *H01L 21/02266* (2013.01); *H01L 21/0332* (2013.01); *H01L 21/0337* (2013.01); *H01L 21/31051* (2013.01); *H01L 21/02126* (2013.01)

(58) Field of Classification Search
  CPC .. G03F 7/2004; G03F 7/2022; G03F 7/20–24; G03F 7/70–70991
  See application file for complete search history.

(56) References Cited

U.S. PATENT DOCUMENTS

| | | | |
|---|---|---|---|
| 9,391,074 B1* | 7/2016 | Leobandung | H01L 27/0886 |
| 9,905,424 B1* | 2/2018 | Law | H01L 21/0338 |
| 2016/0118263 A1 | 4/2016 | Leobandung | |
| 2017/0140986 A1 | 5/2017 | Machkaoutsan et al. | |
| 2017/0221704 A1 | 8/2017 | Mohanty et al. | |
| 2017/0301552 A1 | 10/2017 | deVilliers | |
| 2017/0338116 A1 | 11/2017 | deVilliers et al. | |
| 2018/0047584 A1 | 2/2018 | Pereira et al. | |
| 2018/0076035 A1* | 3/2018 | Bergendahl | H01L 21/0337 |
| 2018/0090491 A1* | 3/2018 | Huang | H01L 21/76224 |
| 2018/0174854 A1* | 6/2018 | Tseng | H01L 21/3086 |
| 2018/0315602 A1* | 11/2018 | Tseng | H01L 21/0338 |
| 2019/0096666 A1* | 3/2019 | Zhou | H01L 21/02282 |

OTHER PUBLICATIONS

Chen, "Planarity Considerations in SADP for Advanced BEOL Patterning", IEEE International Interconnect Technology Conference, May 2017, pp. 1-3.

Lazzarino, "Self-aligned Block Technology: a Step Toward Further Scaling", Proceedings of SPIE, Apr. 2017, pp. 1-11.

Mohanty, "LER Improvement for Sub-32nm Pitch Self-Aligned Quadruple Patterning (SAQP) at Back End of Line (BEOL)", Proceeding of SPIE, Mar. 2016, pp. 1-16.

Mohanty, "EPE Improvement Thru Self-Alignment Via Multi-Color Material Integration", Proceedings of SPIE, Apr. 2017, pp. 1-16.

Goldfarb, "Fabrication of Dual Damascene BEOL Structure Using a Multi-Level Multiple Exposure (MLME) Scheme—Part 1. Lithographing Patterning", Proceedings of SPIE, Mar. 2010, pp. 1-13.

Harrer, "Fabrication of Dual Damascene BEOL Structure Using a Multi-Level Multiple Exposure (MLME) Scheme—Part 2. RIE-based Pattern Transfer and Completion of Duel Damascene Process Yielding an Electrically Functional via Chain", Proceedings of SPIE, Mar. 2010, pp. 1-12.

* cited by examiner

MULTIPLE PATTERNING SCHEME INTEGRATION WITH PLANARIZED CUT PATTERNING

BACKGROUND

Technical Field

The present invention generally relates to semiconductor devices, and more particularly to multiple patterning scheme integration with planarized cut patterning.

Description of the Related Art

Multiple patterning, or multi-patterning, refers to a class of technologies for manufacturing integrated circuits. Examples of multi-patterning schemes include self-aligned patterning schemes, such as, e.g., self-aligned double patterning (SADP) and self-aligned quadruple patterning (SAQP). Multi-patterning schemes, such as SADP, can be used for process integration at e.g., the 7 nm node and beyond.

SUMMARY

In accordance an embodiment of the present invention, a method for fabricating a semiconductor device integrating a multiple patterning scheme is provided. The method includes forming a plurality of mandrels from a base structure, forming a plurality of non-mandrels including a hard mask material having an etch property substantially similar to that of the plurality of mandrels, forming photo-sensitive material over the plurality of mandrels and the plurality of non-mandrels, and applying an exposure scheme to the photo-sensitive material to create at least one mandrel cut pattern and at least one non-mandrel cut pattern.

In accordance with another embodiment of the present invention, a method for fabricating a semiconductor device integrating a multiple patterning scheme is provided. The method includes forming a plurality of mandrels from a base structure, forming a plurality of non-mandrels including a hard mask material having an etch property substantially similar to that of the plurality of mandrels, forming a memorization layer over the plurality of mandrels and the plurality of non-mandrels, and applying an exposure scheme to the memorization layer to create at least one mandrel cut pattern and at least one non-mandrel cut pattern.

In accordance with yet another embodiment of the present invention, a semiconductor device is provided. The device includes a metal cap layer, a dielectric layer disposed on the metal cap layer, a hard mask layer disposed on the dielectric layer, at least one mandrel including a dielectric material disposed on a hard mask layer, and at least one non-mandrel including a hard mask material disposed on the hard mask layer, the hard mask material having an etch property substantially similar to that of the dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
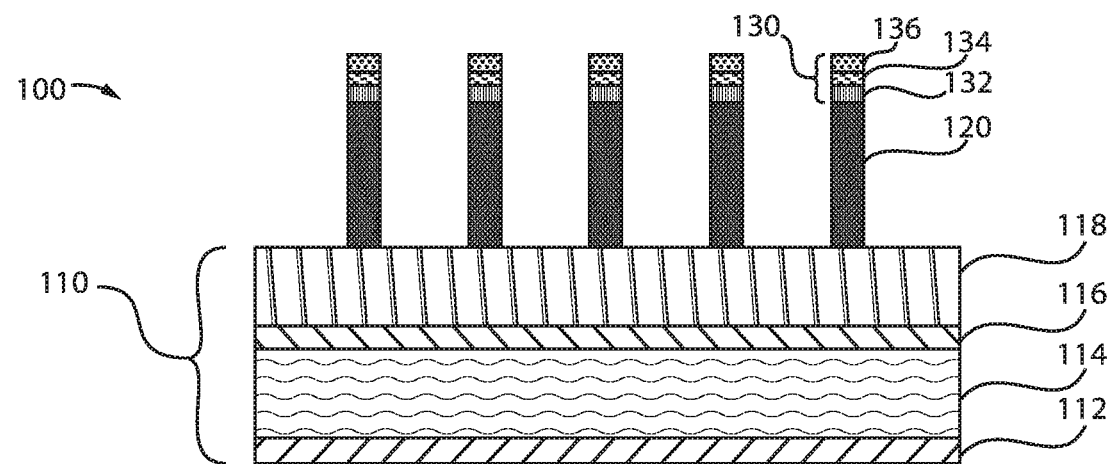
FIG. 1 is a cross-sectional view of mandrel lithography performed during the fabrication of the semiconductor device, in accordance with an embodiment of the present invention.

However, obstacles associated with multi-patterning include complicated multiple cut patterning. For example, different patterning schemes can be needed for mandrel cut pattern(s) and non-mandrel cut pattern(s). To address at least some of the obstacles associated with multi-patterning, the embodiments described herein provide for the fabrication of semiconductor devices that integrate a multi-patterning scheme (e.g., SADP) with planarized cut patterning structure and process. The embodiments described herein can employ a gap fill material (e.g., hard mask material) having etch properties similar to the mandrel by backfilling the non-mandrel region after spacer etch back during the multi-patterning process. Thus, a planarized (e.g., flat) surface can be achieved for the proceeding cut patterning steps. In accordance with one illustrative embodiment, the cut patterning can be enabled as a single exposure (e.g., single extreme ultraviolet (EUV) lithography exposure). In an another illustrative embodiment, the cut patterning can be enabled as multiple exposures (e.g., multiple EUV exposures). The embodiments described herein can enable a flat surface for cut patterning in a multi-patterning scheme (e.g., SADP), such that multiple cut patterns can share the same multi-patterning scheme. Furthermore, uniform cut size can be achieved, and scalability of multi-patterning integration beyond the 7 nm regime can be enabled.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-16 depict respective steps of process flows for fabricating semiconductor devices integrating respective multi-patterning schemes.

In the illustrative embodiment depicted in FIGS. 1-8, the multi-patterning scheme includes a single exposure scheme to expose at least one mandrel cut pattern and at least one non-mandrel cut pattern.

Figure 9:
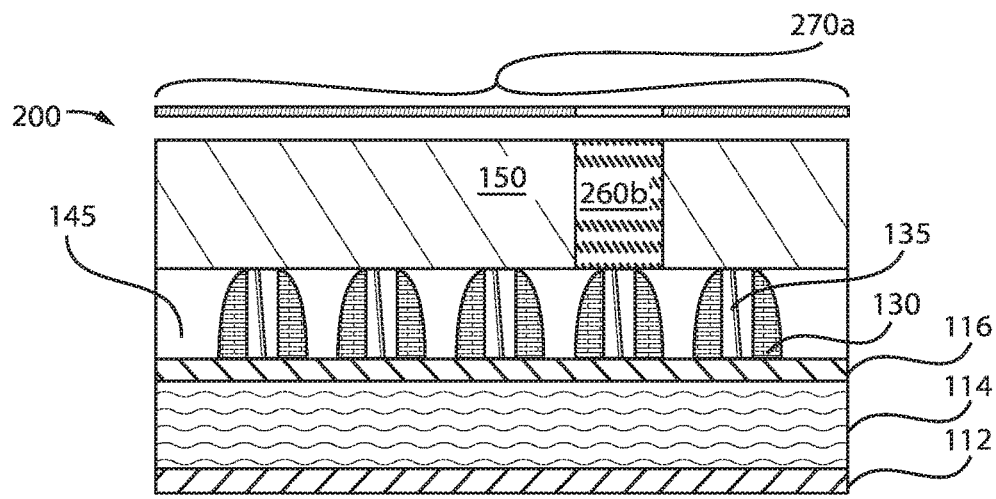
FIG. 9 is a cross-sectional view of lithography exposure for at least one mandrel cut pattern of a double exposure scheme performed during the fabrication of the semiconductor device, in accordance with another embodiment of the present invention.
Figure 10:
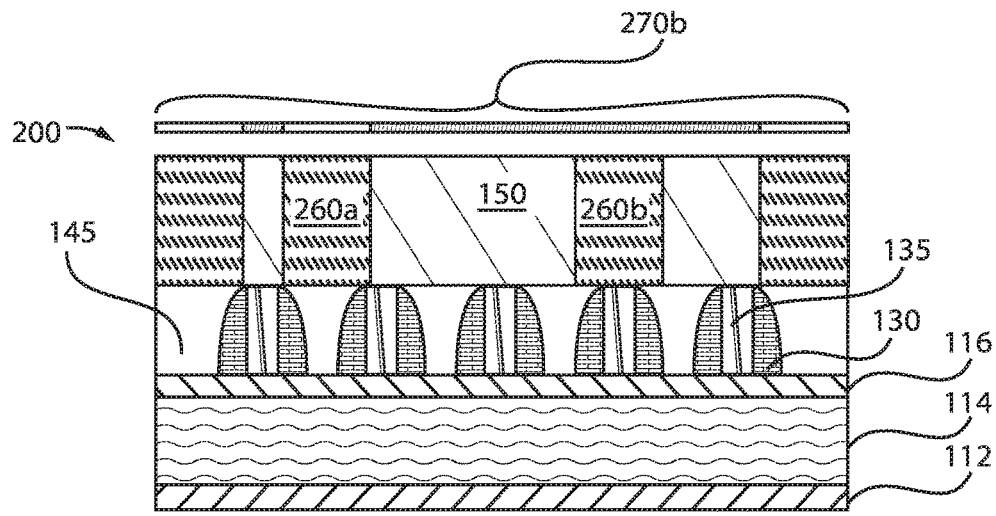
FIG. 10 is a cross-sectional view of lithography exposure for of at least one non-mandrel cut pattern of a double exposure scheme performed during the fabrication of the semiconductor device, in accordance with another embodiment of the present invention.
Figure 11:
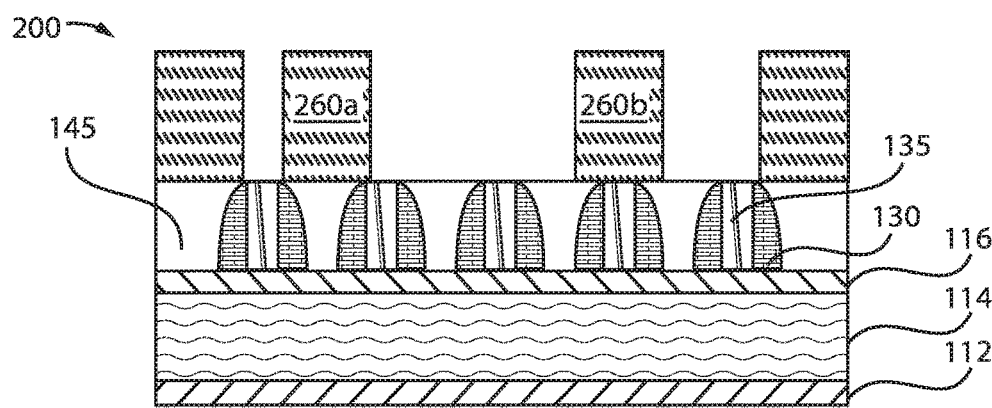
FIG. 11 is a cross-sectional view of the removal of the remaining photo-sensitive material after the cut patterns are exposed during the fabrication of the semiconductor device, in accordance with another embodiment of the present invention.

In the illustrative embodiment depicted in FIGS. 9-11, the multi-patterning scheme includes a double exposure scheme to expose the mandrel and non-mandrel cut patterns.

In the illustrative embodiment depicted in FIGS. 12-16, the multi-patterning scheme includes a litho-etch-litho-etch scheme to expose the mandrel and non-mandrel cut patterns.

Referring now to FIG. 1, a cross-sectional view is provided showing an exemplary semiconductor device 100 having a base structure 110. The base structure 110 includes a metal cap layer 112, a dielectric layer 114, a hard mask layer 116 and a dielectric layer 118. The metal cap layer 112 can include any suitable material in accordance with the embodiments described herein. The dielectric layer 114 is an inter-metal dielectric (IMD) layer, and can include any suitable material in accordance with the embodiments described herein. The hard mask layer 116 can include, e.g., titanium nitride (TiN), although any suitable material can be used in accordance with the embodiments described herein. As will be described in further detail below, mandrels will be formed from the dielectric layer 118. As such, any suitable material can be used to form the dielectric layer 118 in accordance with the embodiments described herein (e.g., an oxide material). For example, the dielectric layer 118 can include an oxide formed by a chemical vapor deposition (CVD) process (e.g., plasma-enhanced CVD (PECVD). In one embodiment, the dielectric layer 118 includes a PECVD tetraethyl orthosilicate (TEOS) oxide.

As further shown, mandrel lithography is performed, which includes forming planarization layers 120 on the dielectric layer 118. In one embodiment, the planarization layers 120 include organic planarization layers (OPLs). OPLs can be formed from a photo-sensitive organic polymer including a light-sensitive material that, when exposed to radiation (e.g., electromagnetic radiation), is chemically altered for removal using a solvent. Examples of photo-sensitive organic polymers for use as OPLs include, but are not limited to, polyacrylate resin, epoxy resin, phenol resin, polyamide resin, polyimide resin, unsaturated polyester resin, polyphenylenether resin, polyphenylenesulfide resin, or benzocyclobutene (BCB). However, any suitable material can be used in accordance with the embodiments described herein.

The materials of the planarization layers 120 are selected to be compatible with a resist stack 130 formed on respective ones of the planarization layers 120. The resist stack 130 can each include a hard mask layer 132, an anti-reflective coating (ARC) layer 134 and a resist layer 136.

The hard mask layer 132 can include a dielectric hard mask material. Examples of dielectric hard mask materials include, e.g., silicon nitrides, silicon oxides, silicon oxynitrides, silicon carbides, silicon carbonitrides, etc. Spin-on dielectrics may also be utilized as a hard mask material include, e.g., silsequioxanes, siloxanes, and boron phosphate silicate glass (BPSG). However, any suitable material can be used in accordance with the embodiments described herein.

As shown, the ARC layer 134 is a bottom ARC (BARC) layer since it is formed underneath the resist layer 136. The ARC layer 134 includes a material having light absorbing compounds, and uses destructive interference at the interfaces of the ARC layer 134 and the photoresist layer 136. The material of the ARC layer 134 is chosen to have a refractive index suitable for use in accordance with the embodiments described herein. For example, the ARC layer 134 can include any suitable organic and/or inorganic ARC materials.

The resist layer 136 can include any suitable resist material in accordance with the embodiments described herein.

Figure 2:
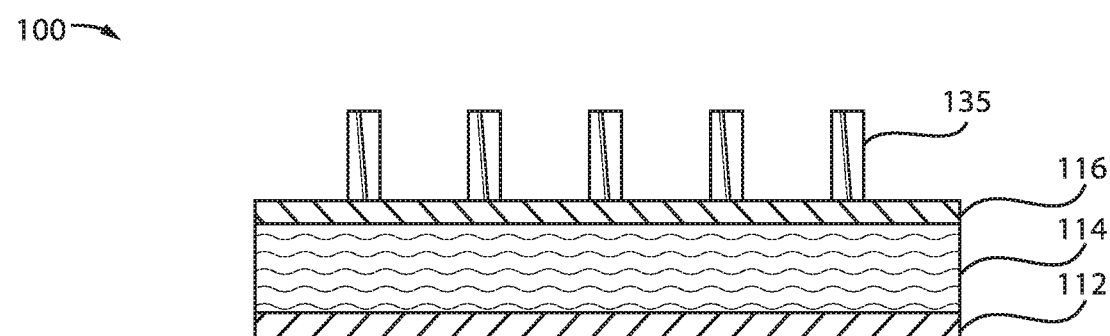
FIG. 2 is a cross-sectional view of a mandrel etch and removal of a planarization layer performed during the fabrication of the semiconductor device, in accordance with an embodiment of the present invention.

Referring to FIG. 2, mandrels 135 are created from the dielectric layer 118, and the photoresist stacks 130 and the planarization layers 120 are removed. Any suitable processes can be used in accordance with the embodiments described herein. For example, a combination of etch processes and/or chemical stripping processes can be used.

Figure 3:
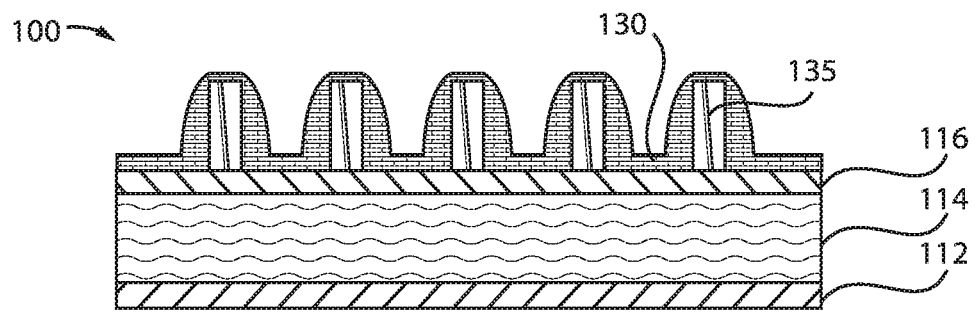
FIG. 3 is a cross-sectional view of a spacer layer formed during the fabrication of the semiconductor device, in accordance with an embodiment of the present invention

Referring to FIG. 3, a spacer layer 130 is formed using any suitable process in accordance with the embodiments described herein. The spacer layer 130 can include, e.g., silicon nitride (SiN), although any suitable material can be used in accordance with the embodiments described herein.

Figure 4:
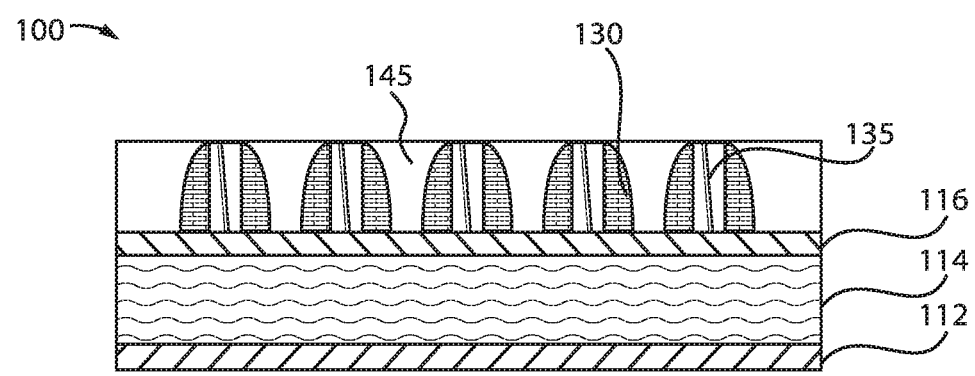
FIG. 4 is a cross-sectional view of an etch back of the spacer layer and formation of a hard mask material during the fabrication of the semiconductor device, in accordance with an embodiment of the present invention.

Referring to FIG. 4, an etch back is performed to expose gaps between the mandrels 135, referred to herein as "non-mandrel regions," a hard mask 140 is formed within the non-mandrel regions, and an etch back is performed to create "non-mandrels" 145 in the non-mandrel regions from the hard mask 140, using any suitable processes in accordance with the embodiments described herein. The hard mask 140 includes a material that has an etch property substantially similar to that of the material of the mandrels 135 (e.g., the material of the dielectric layer 118). For example, the hard mask 140 can include a spin-on-glass (SOG) material. In one embodiment, the SOG material can include a silicone-based polymer (e.g., a polydimethylsiloxane (PDMS)-based polymer). In another embodiment, the hard mask 140 can include a spin-on-carbon (SOC) material. Accordingly, mandrels 135 and non-mandrels 145 include materials having substantially similar etch properties.

Figure 5:
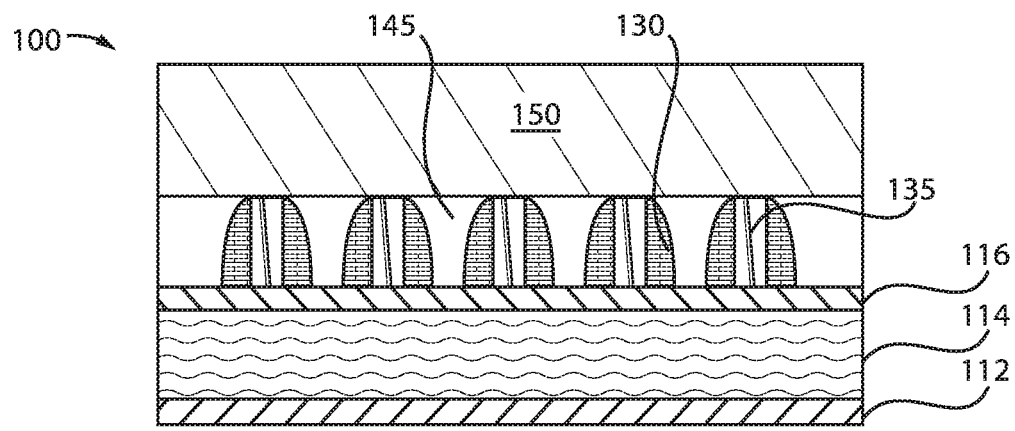
FIG. 5 is a cross-sectional view of a photo-sensitive material formed during the fabrication of the semiconductor device, in accordance with an embodiment of the present invention.

Referring to FIG. 5, photo-sensitive material 150 is formed using any suitable material in accordance with the embodiments described herein. The photo-sensitive material 150 is formed for implementation in a self-aligned block (SAB) lithography scheme to create both mandrel and non-mandrel cut patterns.

Figure 6:
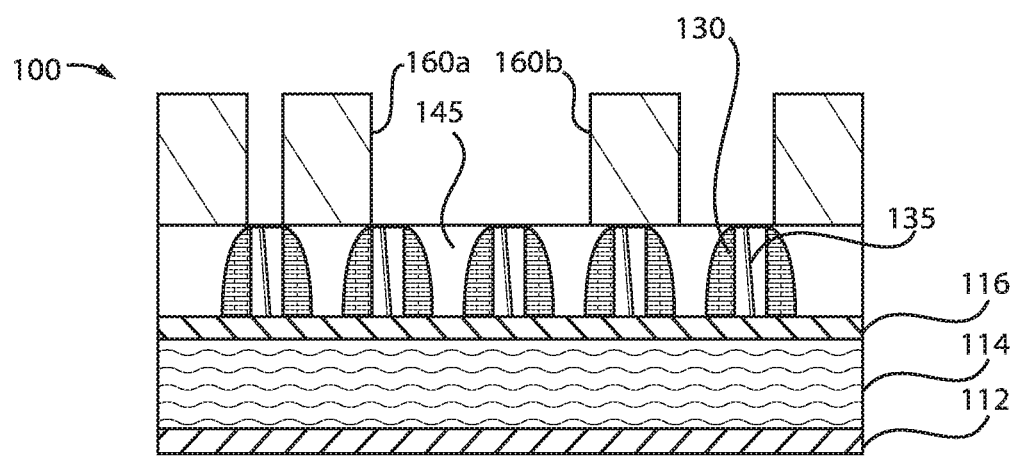
FIG. 6 is a cross-sectional view of a single exposure scheme performed to expose cut patterns during the fabrication of the semiconductor device, in accordance with an embodiment of the present invention.

Referring to FIG. 6, at least one non-mandrel cut pattern 160a and at least one mandrel cut pattern 160b can be simultaneously created over at least one of the non-mandrels 145 and at least one of the mandrels 135 by applying a single exposure scheme (e.g., single EUV exposure) to the photo-sensitive material 150. As shown in FIG. 10, three non-mandrel cut patterns 160a and one mandrel cut pattern 160b are created. However, such an arrangement should not be considered limiting. Thus, a single SAB lithography scheme can be enabled for both the non-mandrel and mandrel cut patterns 160a and 160b for, e.g., a 7 nm node.

As will be described in further detail below with reference to FIGS. 10-12, the non-mandrel and mandrel cut patterns can, in an alternative embodiment, be created by applying a double exposure scheme to the photo-sensitive material. Thus, a double SAB lithography scheme can be enabled for both the non-mandrel and mandrel cut patterns for, e.g., beyond a 7 nm node.

Figure 7:
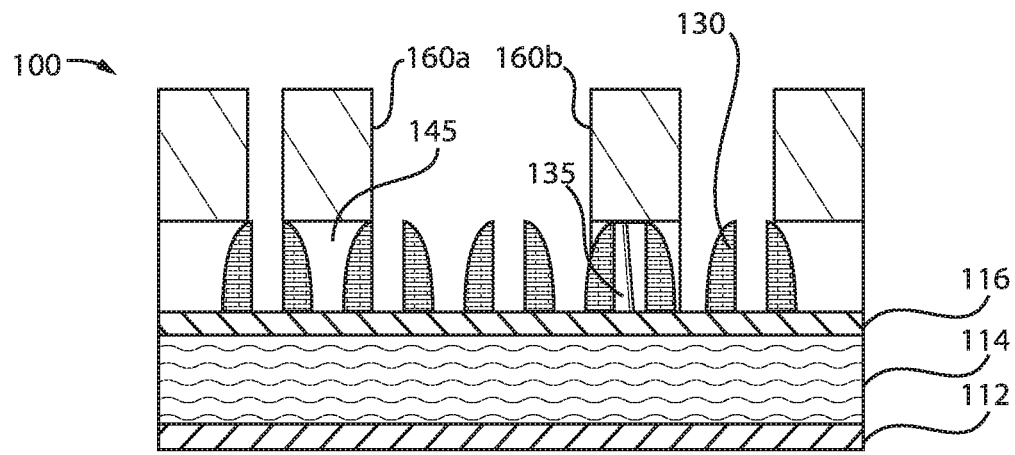
FIG. 7 is a cross-sectional view of the removal of mandrels and non-mandrels during the fabrication of the semiconductor device, in accordance with an embodiment of the present invention.

Referring to FIG. 7, those of the mandrels 135 and the non-mandrels 145 that are not covered by the cut patterns 160a and 160b are removed or pulled out (e.g., by etching).

Figure 8:
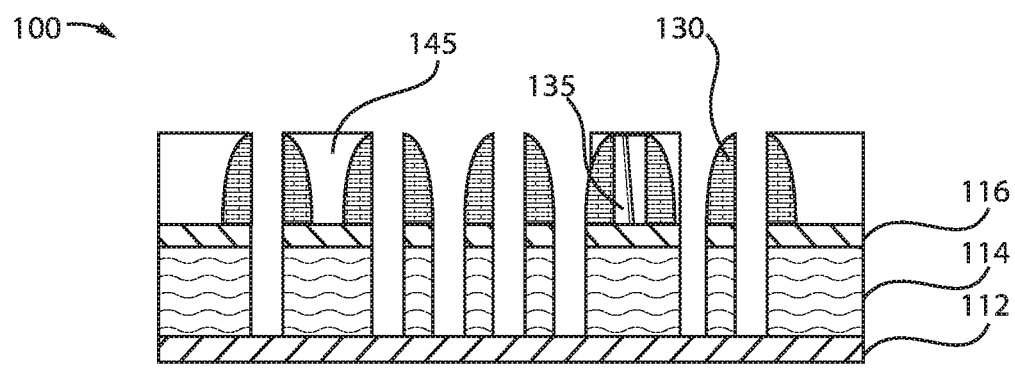
FIG. 8 is a cross-sectional view of further processing performed during the fabrication of the semiconductor device, in accordance with an embodiment of the present invention.

Referring to FIG. 8, one or more etch processes are performed to remove the exposed portions of the hard mask layer 116, and the portions of the dielectric layer 114 exposed after the removal of the exposed portions of the hard mask layer 116. Although not explicitly shown in FIG. 14, portions of the mandrels 135 and the non-mandrels 145 can also be removed during the removal of the dielectric layer 114. Any suitable processes can be used to remove the cut patterns, remove the portions of the hard mask layer 116, and remove the portions of the dielectric layer 114 in accordance with the embodiments described herein.

As mentioned above, the mandrel and non-mandrel cut patterns can be created using a double exposure scheme (e.g., double EUV exposure), as will now be described with reference to FIGS. 9-11. It is be assumed that semiconductor device 200 described in FIGS. 9-11 has been processed in accordance with FIG. 5.

Referring to FIG. 9, a lithography exposure is performed to create at least one mandrel cut pattern 260b using a mask 270a. As shown in FIG. 9, one mandrel cut pattern 260b is created. However, such an arrangement should not be considered limiting.

Referring to FIG. 10, a lithography exposure is performed to create at least one non-mandrel cut pattern 260a. As shown in FIG. 10, three non-mandrel cut patterns 260a are created. However, such an arrangement should not be considered limiting.

Referring to FIG. 11, the remaining photo-sensitive material 150 is removed using any suitable process in accordance with the embodiments described herein.

Further downstream processing, including the processing described above in FIGS. 7 and 8, can be performed on the device 200.

A multi-patterning scheme including a litho-etch-litho-etch scheme to expose the mandrel and non-mandrel cut patterns will now be described with reference to FIGS. 12-16. It is assumed that that semiconductor device 300 described in FIGS. 12-16 has been processed in accordance with FIG. 4.

Figure 12:
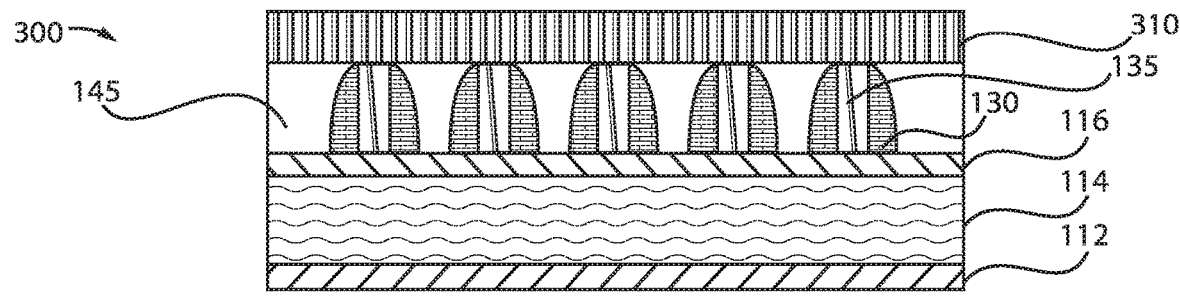
FIG. 12 is a cross-sectional view of a memorization layer formed during the fabrication of the semiconductor device, in accordance with yet another embodiment of the present invention.

Referring to FIG. 12, a memorization layer 310 is formed using any suitable process in accordance with the embodiments described herein. The memorization layer 310 can include, e.g., a titanium oxide ($TiO_x$), although any suitable material can be used in accordance with the embodiments described herein.

Figure 13:
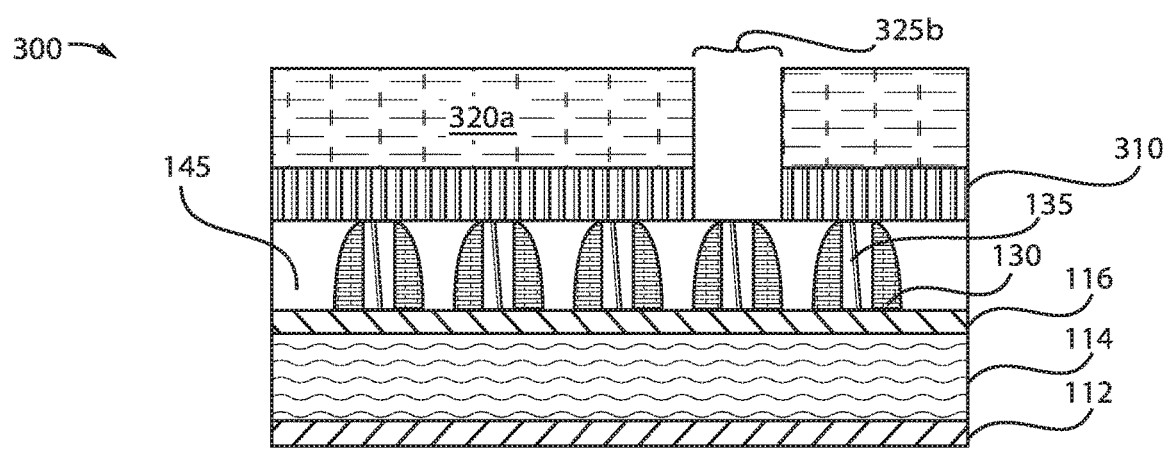
FIG. 13 is a cross-sectional view of lithography to create at least one mandrel cut pattern region, and the removal of a portion of the memorization layer corresponding to the at least one mandrel cut pattern region during the fabrication of the semiconductor device, in accordance with yet another embodiment of the present invention.

Referring to FIG. 13, lithography is performed to expose at least one mandrel cut pattern region 325b within a mask 320a using any suitable process in accordance with the embodiments described herein. As shown in FIG. 13, one mandrel cut pattern region 325b is created. However, such an arrangement should not be considered limiting. Then, an etch process is performed to remove the portion of the memorization layer 310 corresponding to the at least one mandrel cut pattern region 325b. Any suitable process can be used to remove the portion of the memorization layer 310 in accordance with the embodiments described herein.

Figure 14:
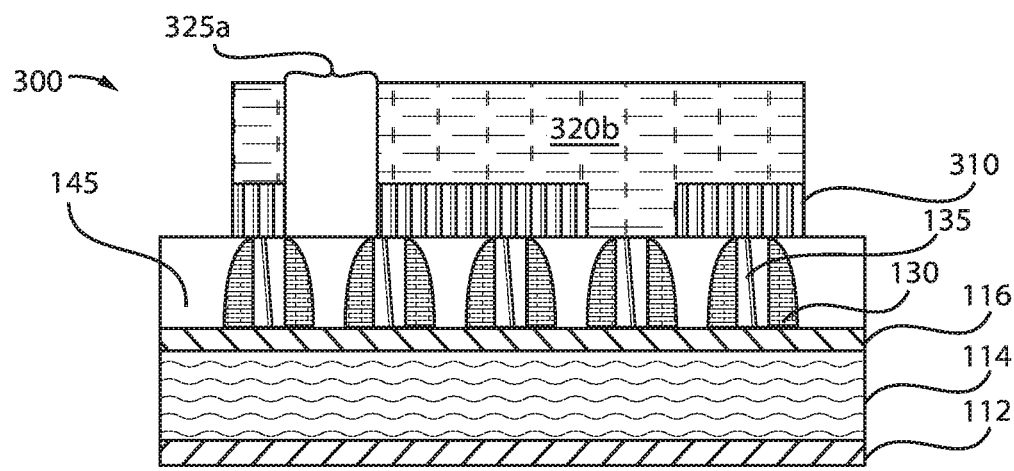
FIG. 14 is a cross-sectional view of lithography to create at least one non-mandrel cut pattern region, and the removal of a portion of the memorization layer corresponding to the at least one non-mandrel cut region during the fabrication of the semiconductor device, in accordance with yet another embodiment of the present invention.

Referring to FIG. 14, lithography is performed to expose at least one non-mandrel cut pattern region 325a within a mask 320b, which fills the mandrel cut pattern region 325b. As shown in FIG. 21, three non-mandrel cut patterns 260a are created. However, such an arrangement should not be considered limiting. Then, an etch process is performed to remove the portion of the memorization layer 310 corresponding to the at least one non-mandrel cut pattern region 325a. Any suitable process can be used to remove the portion of the memorization layer 310 in accordance with the embodiments described herein.

Figure 15:
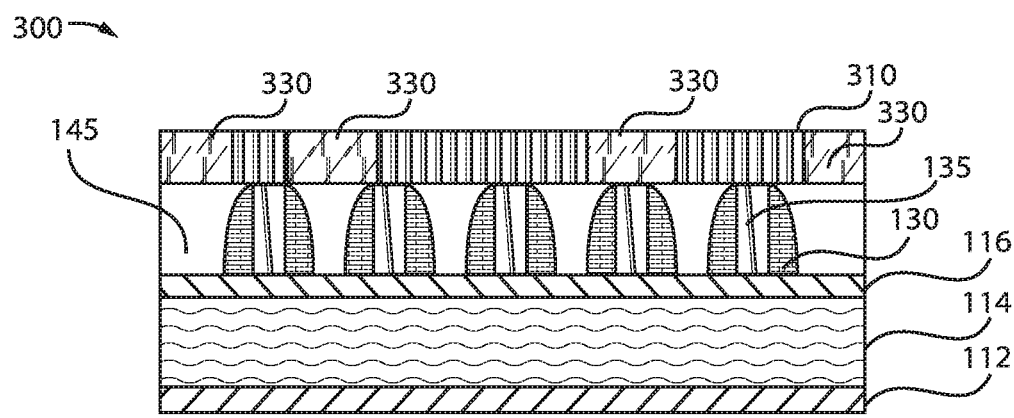
FIG. 15 is a cross-sectional view of cut patterns formed during the fabrication of the semiconductor device, in accordance with yet another embodiment of the present invention.

Referring to FIG. 15, at least one non-mandrel cut pattern 330a is formed in the at least one non-mandrel cut pattern region 325a and at least one mandrel cut pattern 330b is formed in the at least one mandrel cut pattern region 325b. The cut patterns 330a and 330b can be formed by employing backfill and etch back processes. The cut patterns 330a and 330b can include, e.g., silicon nitride (SiN), although any suitable material can be used in accordance with the embodiments described herein.

Figure 16:
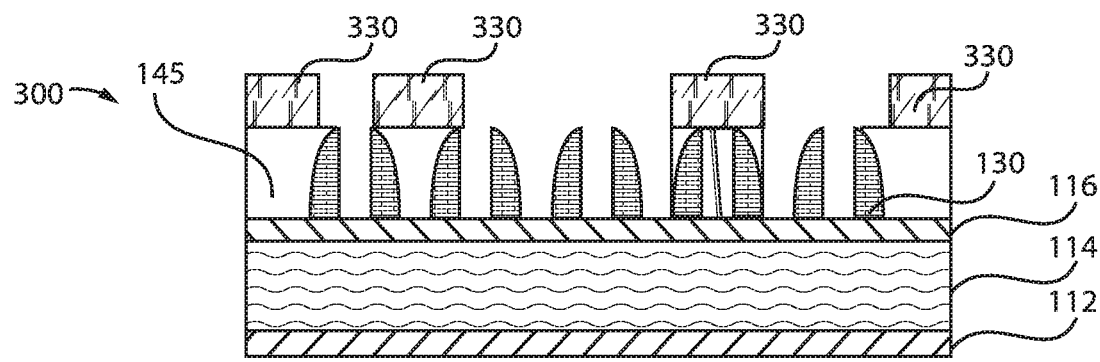
FIG. 16 is a cross-sectional view of the removal of the remaining memorization layer, and the removal of mandrels and non-mandrels during the fabrication of the semiconductor device, in accordance with yet another embodiment of the present invention.

Referring to FIG. 16, the remaining portion of the memorization layer 310 is removed, and those of the mandrels 135 and the non-mandrels 145 that are not covered by the cut patterns 160a and 160b are removed or pulled out (e.g., by etching). Any suitable processes can be used to remove the remaining portion of the memorization layer 310 and those of the mandrels 135 and non-mandrels 145 that are not covered by the cut patterns, in accordance with the embodiments described herein.

Further downstream processing, including the processing described above in FIG. 8, can be performed on the device 300.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:
1. A method for fabricating a semiconductor device integrating a multiple patterning scheme, comprising:
    forming a plurality of mandrels from a base structure;
    forming a plurality of non-mandrels, including:
        etching back a spacer layer to form gaps between the plurality of mandrels;

forming hard mask material in the gaps having an etch property substantially similar to that of the plurality of mandrels; and etching back the hard mask material to form the plurality of non-mandrels;

forming photo-sensitive material over the plurality of mandrels and the plurality of non-mandrels; and applying an exposure scheme to the photo-sensitive material to create at least one mandrel cut pattern and at least one non-mandrel cut pattern.

2. The method of claim 1, wherein the hard mask material includes spin-on-glass (SOG) or spin-on-carbon (SOC).

3. The method of claim 2, wherein the SOG includes a silicon-based SOG material.

4. The method of claim 1, wherein the exposure scheme is a single exposure scheme to simultaneously create the mandrel and non-mandrel cut patterns.

5. The method of claim 1, wherein the exposure scheme is a double exposure scheme.

6. The method of claim 5, wherein applying the double exposure scheme to the photo-sensitive material further includes:

performing a first lithography exposure to create the at least one mandrel cut pattern; and performing a second lithography exposure to create the at least one non-mandrel cut pattern.

7. The method of claim 1, wherein the base structure includes a metal cap layer, a first dielectric layer formed on the metal cap layer, a hard mask layer formed on the IMD layer, and a second dielectric layer formed on the hard mask layer, and wherein the plurality of mandrels include material from the second dielectric layer.

8. The method of claim 7, further comprising:

removing mandrels and non-mandrels not covered by the mandrel and non-mandrel cut patterns;

removing the mandrel and non-mandrel cut pattern;

removing exposed portions of the hard mask layer; and removing exposed portions of the first dielectric layer.

9. A method for fabricating a semiconductor device integrating a multiple patterning scheme, comprising:

forming a plurality of mandrels from a base structure;

forming a plurality of non-mandrels including hard mask material having an etch property substantially similar to that of the plurality of mandrels;

forming photo-sensitive material over the plurality of mandrels and the plurality of non-mandrels; and applying a double exposure scheme to the photo-sensitive material to create at least one mandrel cut pattern and at least one non-mandrel cut pattern, including performing a first lithography exposure to create the at least one mandrel cut pattern, and performing a second lithography exposure to create the at least one non-mandrel cut pattern.

10. The method of claim 9, further comprising:

forming a spacer layer;

performing an etch back of the spacer layer to create gaps between the mandrels;

forming the hard mask material in the gaps; and performing an etch back to form the plurality of non-mandrels.

11. The method of claim 9, wherein the hard mask material includes spin-on-glass (SOG) or spin-on-carbon (SOC).

12. The method of claim 9, wherein the exposure scheme is a single exposure scheme to simultaneously create the mandrel and non-mandrel cut patterns.

13. The method of claim 9, wherein the base structure includes a metal cap layer, a first dielectric layer formed on the metal cap layer, a hard mask layer formed on the IMD layer, and a second dielectric layer is formed on the hard mask layer, and wherein the mandrels include material from the second dielectric layer.

14. The method of claim 13, further comprising:

removing mandrels and non-mandrels not covered by the mandrel and non-mandrel cut patterns;

removing the mandrel and non-mandrel cut pattern;

removing exposed portions of the hard mask layer; and removing exposed portions of the first dielectric layer.

15. A method for fabricating a semiconductor device integrating a multiple patterning scheme, comprising:

forming a plurality of mandrels from a base structure, the base structure including a metal cap layer, a first dielectric layer formed on the metal cap layer, a hard mask layer formed on the IMD layer, and a second dielectric layer is formed on the hard mask layer, and wherein the mandrels include material from the second dielectric layer;

forming a plurality of non-mandrels including hard mask material having an etch property substantially similar to that of the plurality of mandrels;

forming photo-sensitive material over the plurality of mandrels and the plurality of non-mandrels; and applying an exposure scheme to the photo-sensitive material to create at least one mandrel cut pattern and at least one non-mandrel cut pattern.

16. The method of claim 15, further comprising:

forming a spacer layer;

performing an etch back of the spacer layer to create gaps between the mandrels;

forming the hard mask material in the gaps; and performing an etch back to form the plurality of non-mandrels.

17. The method of claim 15, wherein the hard mask material includes spin-on-glass (SOG) or spin-on-carbon (SOC).

18. The method of claim 15, wherein the exposure scheme is a single exposure scheme to simultaneously create the mandrel and non-mandrel cut patterns.

19. The method of claim 15, wherein the exposure scheme is a double exposure scheme, and wherein applying the double exposure scheme to the photo-sensitive material further includes:

performing a first lithography exposure to create the at least one mandrel cut pattern; and performing a second lithography exposure to create the at least one non-mandrel cut pattern.

20. The method of claim 15, further comprising:

removing mandrels and non-mandrels not covered by the mandrel and non-mandrel cut patterns;

removing the mandrel and non-mandrel cut pattern;

removing exposed portions of the hard mask layer; and removing exposed portions of the first dielectric layer.

* * * * *